United States Patent
Damarla

(12) 
(10) Patent No.: US 6,367,043 B1
(45) Date of Patent: Apr. 2, 2002

(54) IMPLEMENTATION OF SIGNATURE ANALYSIS FOR ANALOG AND MIXED SIGNAL CIRCUITS

(75) Inventor: Thyagaraju Damarla, Germantown, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 09/275,269

(22) Filed: Mar. 23, 1999

(51) Int. Cl.[7] ............................................. G01R 31/28
(52) U.S. Cl. ..................... 714/733; 714/742; 714/736
(58) Field of Search .................. 714/733, 734, 714/736, 819, 742, 724, 778, 738, 739, 811; 324/763, 527, 158.1

(56) References Cited

U.S. PATENT DOCUMENTS 3,622,876 A  * 11/1971  Ure et al. ..................... 714/734
4,763,066 A  * 8/1988   Yeung et al. ............... 324/73.1
5,646,521 A  * 7/1997   Rosenthal et al. ........ 324/158.1

* cited by examiner

*Primary Examiner*—Christine T. Tu
(74) *Attorney, Agent, or Firm*—Paul S. Clohan, Jr.; Edward L. Stolarun

(57) ABSTRACT

A built-in test system for analog or mixed signal circuits comprises a discretizer for discretizing analog test signals monitored at various node points of the circuit under test into suitable discrete values. The discrete values are compared with a reference signature in an analog signature generator to determine if a fault is likely. Since analog signature generators use multilevel data, the computations are performed in Galois field GF(p), where p is the radix. The analog signature generator is constructed using current-mode shift registers, signal discretizers, signal level shifters, mod-p adders, subtractors and multipliers.

16 Claims, 19 Drawing Sheets

| i | COEFFICIENTS OF $X^1\ X^0$ | i | COEFFICIENTS OF $X^1\ X^0$ |
|---|---|---|---|
| 0 | 0 1 | 12 | 0 4 |
| 1 | 1 0 | 13 | 4 0 |
| 2 | 1 3 | 14 | 4 2 |
| 3 | 4 3 | 15 | 1 2 |
| 4 | 2 2 | 16 | 3 3 |
| 5 | 4 1 | 17 | 1 4 |
| 6 | 0 2 | 18 | 0 3 |
| 7 | 2 0 | 19 | 3 0 |
| 8 | 2 1 | 20 | 3 4 |
| 9 | 3 1 | 21 | 2 4 |
| 10 | 4 4 | 22 | 1 4 |
| 11 | 3 2 | 23 | 2 3 |

FIG. 19

IMPLEMENTATION OF SIGNATURE ANALYSIS FOR ANALOG AND MIXED SIGNAL CIRCUITS

BACKGROUND OF THE INVENTION

Field of the Invention

The present invention pertains to the field of very large scale integrated (VLSI) circuits employing both analog and mixed signal circuits and their testing using built-in self test (BIST) methods that employ signature analysis to determine whether a circuit/device is faulty or fault free.

At the present time there are no efficient methods to implement a BIST scheme that employs signature analysis to determine whether an analog or mixed signal circuit or device is faulty or fault free. Currently, signal processing systems, radar data analysis systems, cellular phone systems, etc., all use analog and mixed signal circuits which need to be tested during the production time in order to enhance production yield and after production to ensure the proper operation of the system. The present invention helps in testing these devices reliably and automatically at very high speeds thereby saving the industry millions of dollars. Current techniques are very slow and time consuming. For the most part, any company involved in the design of analog and mixed (analog & digital) signal circuits either in small or large scale, as application specific integrated circuits (ASIC) or as VLSI systems can use this invention in order to test their devices either at the production level or after production. The invention leads to rapid testing of analog and mixed signal systems.

Chin-Long Wey and S. Krishnan (I) have developed a BIST structure using "current copiers" as storage elements to monitor node currents at various nodes (test points) in an analog circuit. The current copiers are then concatenated to form a scan path (as shift registers in digital circuits) and the monitored currents are then scanned out to an output of the circuit/device where they will be compared with their expected values. If the difference between the scanned currents and their expected values lie within the specified tolerances, then the circuit/device is judged to be fault free else it is Judged to be faulty. This scheme based on current copiers is difficult to implement and occupies excessively large silicon area in a very large scale integrated (VLSI) circuit as the current copiers employ large capacitors for storing the currents that are monitored. Moreover, the scheme requires a large storage (memory) in a computer to store the expected values of the monitored currents at various nodes in a circuit. The present invention overcomes both of the drawbacks of the BIST scheme proposed by Chin-Long Wey and S. Krishnan (I). Moreover, the BIST scheme in this invention is based on signature analysis while the BIST scheme proposed by Chin-Long, Wey and S. Krishnan (1) is not. The present invention uses sample and hold (SH) circuits for storing monitored currents at various nodes and shifting them by forming scan paths. Instead of comparing the monitored currents with their stored expected values, the monitored currents will be used to generate a signature consisting of only few digits using a linear feedback shift register (LFSR) or multiple input shift register (MISR). The signature for the circuit is then compared with a reference signature. Thousands of monitored currents are compressed into a signature of 20 or fewer digits. Hence, instead of storing thousands of values, one needs to store a signature of, at most, 20 digits. This invention presents the practical implementation of such a BIST scheme and the design of its building blocks.

The present invention responds to the shortcomings, drawbacks and limitations of prior art BIST schemes, and the need for simple and elegant BIST schemes based on signature analysis to test VLSI devices ever increasing in size and complexity. This invention makes testing of VLSI devices consisting of analog and mixed signal circuits easy and automatic. Prior art approaches, methods and techniques are described in the following publications:

(1). Chin-Long Wey and S. Krishnan, "Built-In Self Test (BIST) Structures for Analog Circuit Fault Diagnosis with Current Test Data," IEEE Trans. on Instrumentation and Measurement, Vol, 41, No. 4, August 1992, pp. 535–539.

(2) Mani Soma, "Structure and Concepts for Current-Based Analog Scan," Proc. of 1995 Custom Integrated Circuits Conference. Santa Clara, Calif., pp. 517–520.

(3) S. J. Daubert, D. Vallancourt, and Y P. Tsivids, "Current copier cells," Electronics Letters, Vol. 24, December 1988, pp. 1560–1562.

(4) D. L. Rhodes, G. Tempel and M. Cummings, "Application of Fault Modeling to Continuous Built-In Test (c-BIT) for Microwave and MMIC Circuits," Intl. Jour. of Microwave and Millimeterwave CAD (vol. date, pp.).

SUMMARY OF THE INVENTION

In this application several publications are referenced by Arabic numerals in brackets. Full citations for these publications may be found at the end of the written description immediately preceding the claims. The disclosures of all such publications, in their entireties, are hereby expressly incorporated by reference in this application as if fully set forth, for purposes of indicating the background of the invention and illustrating the state of the art.

Traditionally, signature analysis has been used very successfully for detecting faults in digital systems. In fact, it has become the de-facto standard for detecting faults in digital systems. One of the things that contributes to signature analysis in digital systems is the use of scan path designs (1, 2), which allow the operation of digital systems in two distinct modes, namely, system mode operation and test mode operation. In system mode operation, the system operates normally. In test mode operation, test patterns are applied to the circuit under test (CUT) one at a time and its outputs are applied to a signature generator. At the end of application of all test vectors, what remains in the signature generator is referred to as the "signature." For any fault-free circuit, this signature should be the same as the reference signature, and for faulty circuits, to a high degree of probability, it is different. So one is able to compare the signature generated by a CUT with the reference signature (signature for a fault-free circuit) and determine whether the CUT is faulty or fault free. Due to its simplicity and ease of implementation, signature analysis has become a very useful tool. However, in analog circuits, implementation of signature analysis is difficult for several reasons. While in digital systems the data is always well defined in terms of a "0" state and a "1" state, corresponding to logical zero and logical one output voltages of a digital circuit, in analog systems the output voltage or current of a circuit or a node has no well-defined state. Moreover, the node voltage/current can vary within the specified tolerances as a result of variations in discrete components such as resistors, capacitors, inductors, transistors, etc. Unlike in digital circuits, analog shift registers are difficult to construct, and signature analyzers are essentially discrete in nature.

Prior art techniques utilize current copiers (8, 15) for scan designs. Sample and hold circuits employing "current mode" operation are used to store and shift data, similar to master-slave flip-flops (3,9) in digital systems, which led to scan path designs. Whether current copiers or current-mode sample and hold circuits are used in scan path designs, testing basically consists of monitoring currents at various test points (nodes) in a CUT and shifting these currents to an output port using scan paths. The node currents shifted to an output are then compared with their stored expected values to verify whether the circuit is functioning within the specified tolerances. If any of the node currents is found to be beyond the specified tolerance limits, the CUT is declared faulty. Since no data compression is used or signature generated, the amount of reference data that must be stored is very large. In order to avoid large storage, more often than not, one resorts to limiting the number of test points and number of test vectors used for testing a circuit. This in turn limits the effectiveness of a test in determining whether a circuit is faulty or fault free.

In this invention we present a methodology for designing an analog signature generator. Since digital signals are a subset of analog signals, an analog signature generator can also be readily used for digital signals. Hence, the designs provided in this invention are useful for testing both analog circuits and mixed signal circuits consisting of both analog and digital circuits.

Signature generators are discrete in nature. Hence, to employ signature analysis for testing one has to discretize analog signals, monitored at various node points, into suitable discrete values. Discretization of analog data and the discrete step size are presented in the detailed description of this invention. Since analog signature generators use multilevel data, the computations are performed in Galois field GF(p), where p is the radix. Damarla et al in (4) developed current-based mod-p adders, subtractors, and weighted input and output gates. Using current-mode shift registers, signal discretizers, signal level shifters, mod-p adders, subtractors, multipliers, one can build signature generators where the operations are in Galois field GF(p). If p=2, we have a signature generator for digital systems. The general BIST scheme with LFSR is shown in FIG. 1 and FIG. 2 shows MISR version for analog and mixed signal circuits.

BRIEF DESCRIPTION OF THE DRAWINGS AND TABLE

FIG. 19 is Table 1 that depicts the expected results of the LFSR configuration given in FIG. 17.

DETAILED DESCRIPTION OF THE PRESENT INVENTION

Figure 1:
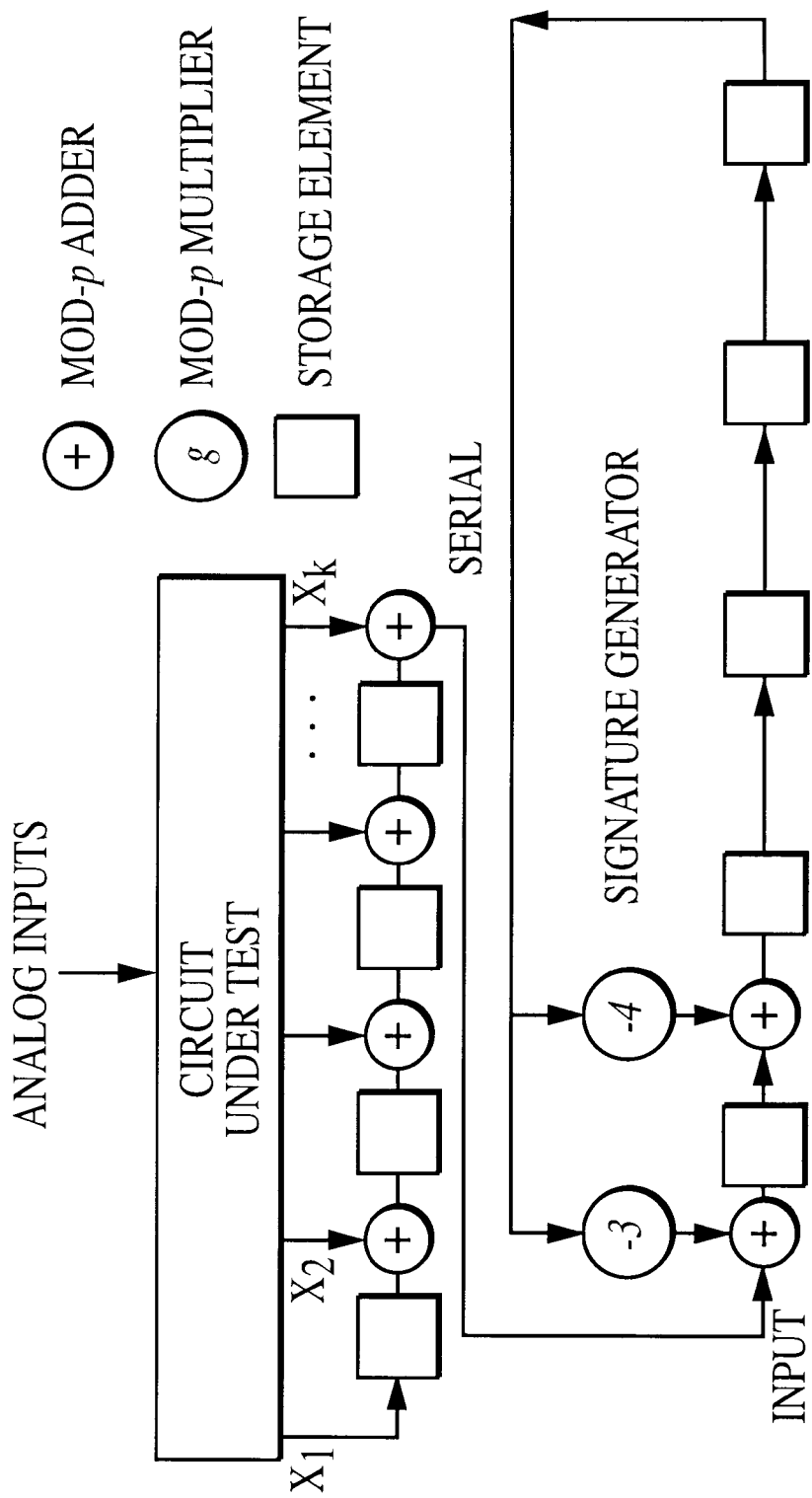
FIG. 1 is a diagram depicting a signature analyzer using a linear feedback shift register (LFSR) for signature Generation.
Figure 2:
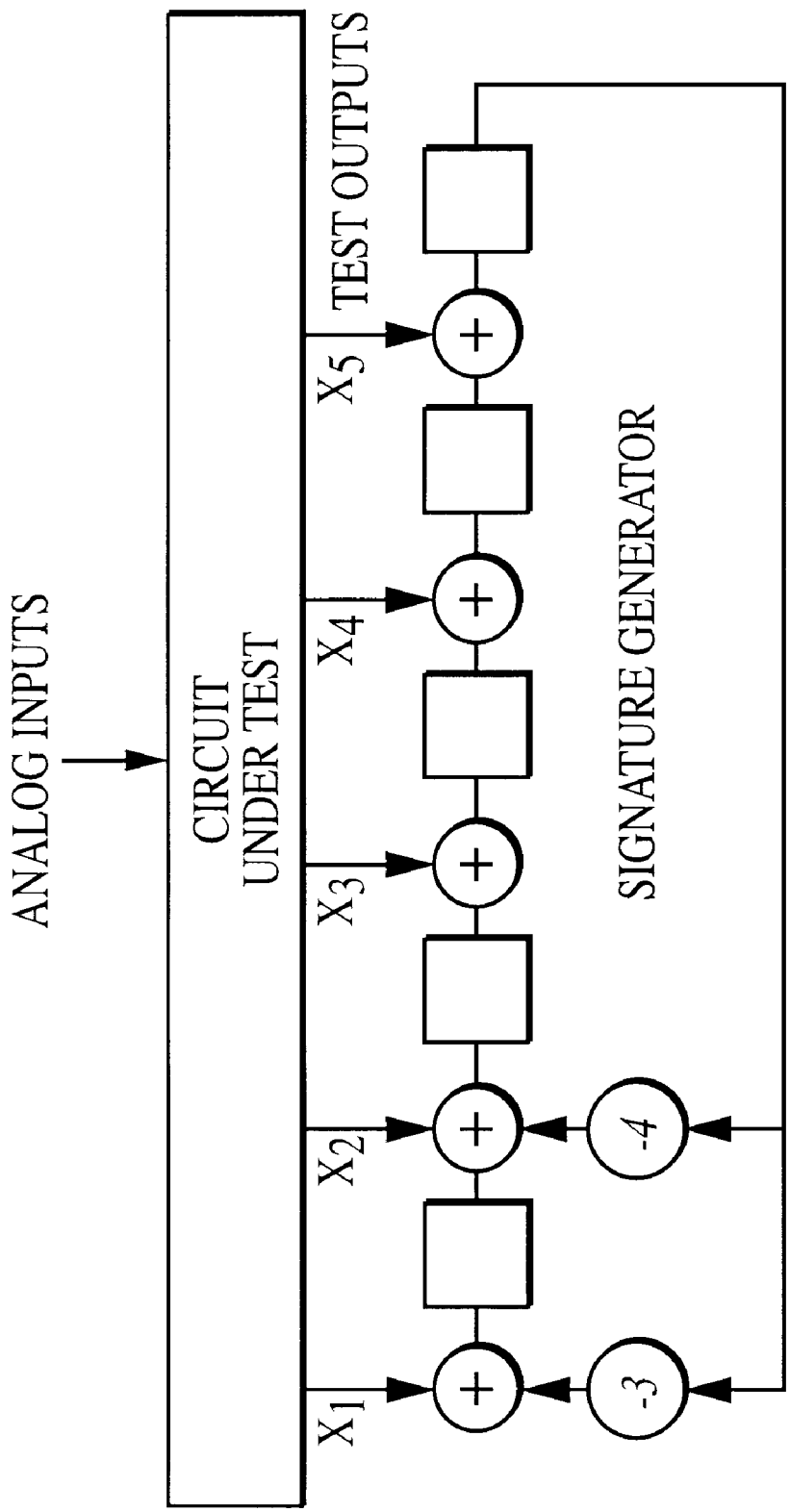
FIG. 2 is a diagram depicting a signature analyzer using a multiple input shift register (MISR) for signature Generation.
Figure 12:
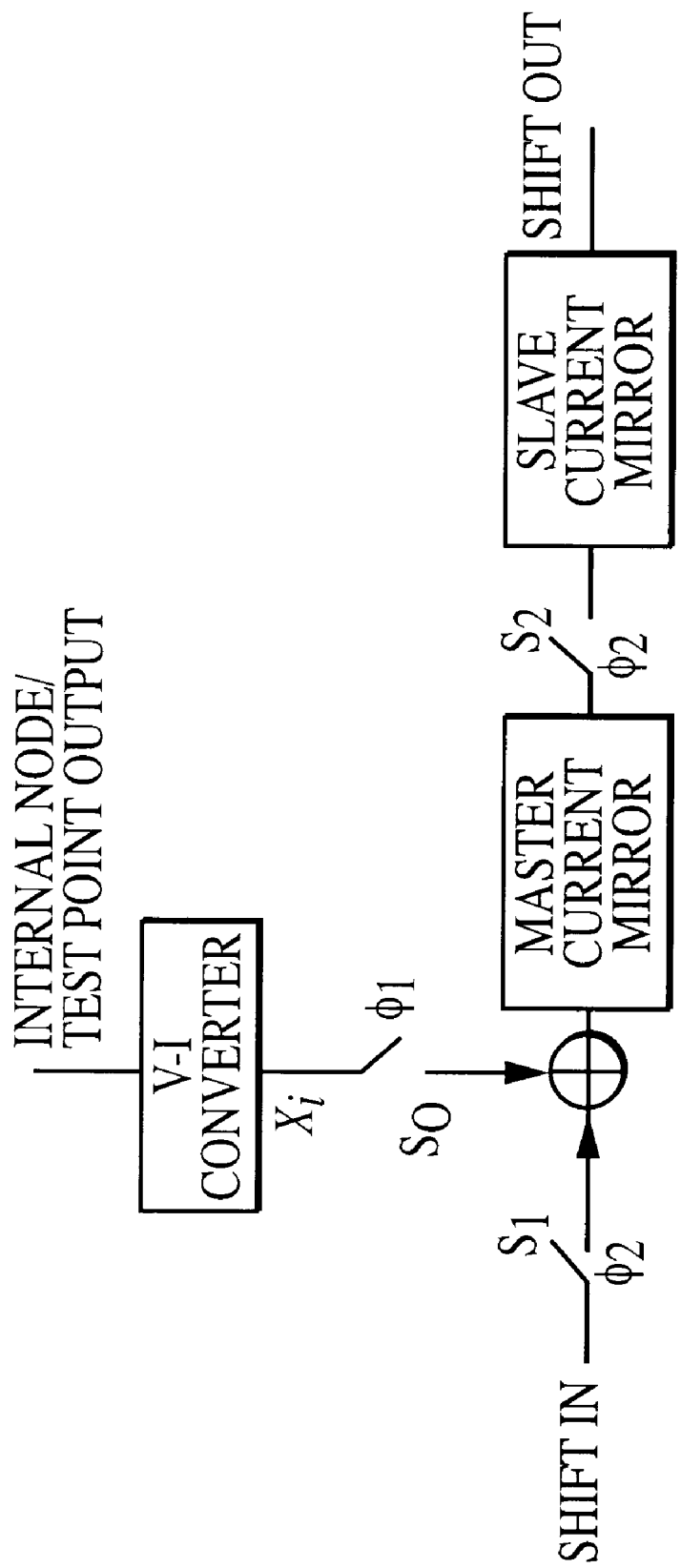
FIG. 12 is a diagram depicting a schematic diagram for a current based analog scan cell.

Preferred general BIST schemes using LFSR and MISR are shown in FIG. 1 and FIG. 2, respectively, for analog and mixed signal circuits. The operation of both the BIST schemes are identical hence we will concentrate on BIST using LFSR for the sake of brevity. In FIG. 1, the circuit under test is the VLSI device consisting of analog or mixed signal circuits that need to be tested using signature analysis. The analog inputs to the CUT are selected carefully for their effectiveness in bringing out the faults in the CUT and their fault coverage. The outputs $\{X_1, X_2, \ldots X_k\}$ are the current outputs monitored at various nodes internal to the CUT. Note that if voltages are monitored at the internal nodes, they should be converted to currents by using any standard voltage to current converters which possess linear characteristics. In FIG. 1, each storage element is a sample and hold circuit whose expanded schematic diagram is shown in FIG. 12. Detailed operation of the sample and hold circuit is explained later. The circuit in FIG. 1 uses two clocks, namely, $\phi_1$ and $\phi_2$, and each storage element consists of two current mirrors, namely, master and slave current mirrors. During the clock $\phi_1$, an analog test signal is applied to the CUT and the monitored signals $\{X_1, X_2, \ldots, X_k\}$ with mod p sum of the adjacent storage data are stored in the master current mirror. During the clock signal $\phi_2$, the contents of the master current mirror are stored in the slave current mirror. This is called the shift operation. The process of loading $\{X_1, X_2, \ldots, X_k\}$ and shifting continues for all the test signals. After applying all the test signals what is left in the signature generator is called the signature of the CUT. This signature is compared with the reference signature to determine whether the CUT is faulty or fault free. Now we will discuss the circuit design aspect of the signature analyzer which makes this invention practical. The designs of various building blocks of signature analyzer and their actual circuit designs and their simulation results alone, with the simulation results of the entire signature generator are presented as an example of implementation of the current invention.

The key part of a preferred BIST scheme shown in FIG. 1 is the signature generator. It is known (5, 6) that a signature generator is nothing but a circuit that divides an input polynomial d(x)

$$d(x)=d_{n-1}x^{n-1}+\ldots+d_1x+d_0,$$

by another polynomial g(x) which is a primitive polynomial over GF(p):

$$g(x)=g_m x^m+g_{m-1}x^{m-1}+\ldots+g_1x+g_0$$

Figure 3:
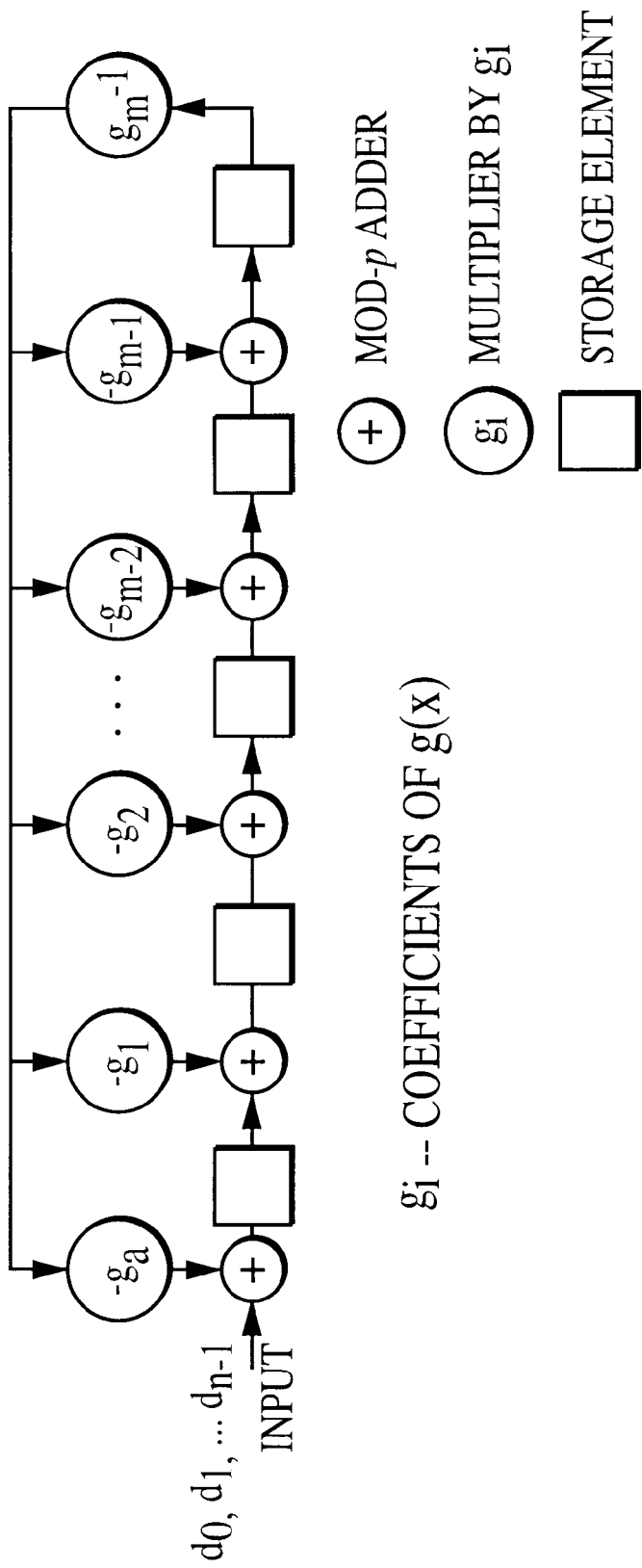
FIG. 3 is a diagram showing a general architecture for a signature generator

The input polynomial d(x) is constructed using monitored data from various test points in a circuit for its coefficients $d_i \in \{0, 1, \ldots, p-1\}$ where p denotes the radix. The general block diagram of a signature generator (6) is shown in FIG. 3 for an arbitrary g(x). After applying all the coefficients $d_i$ one at a time to the input of the signature generator, what is left in the signature generator is referred to as a signature which is nothing but the coefficients $\{r_{m-1}, \ldots, r_1, r_0\}$ the remainder, r(x) where $$d(x)=q(x)g(x)+r(x),$$

where $r(x)=r_{m-1}x^{-1}+\ldots+r_1x+r_0$, $r_i \in \{0, 1, \ldots, p-1\}$ and q(x) is the quotient. From FIG. 3 we find that a signature generator consists of storage elements (shift registers for holding and shifting the input data one digit at a time), multipliers, and mod-p adders. We will now present preferred circuit designs for all these modules. We will present a discretization circuit to convert monitored analog currents into discrete values later. The mod-p adders and multipliers and the storage elements required by the signature generator are built using current mirrors and threshold circuits and their symbols and their circuit designs are presented in FIGS. 4 and 5 respectively.

Current Mirror

Figure 4:
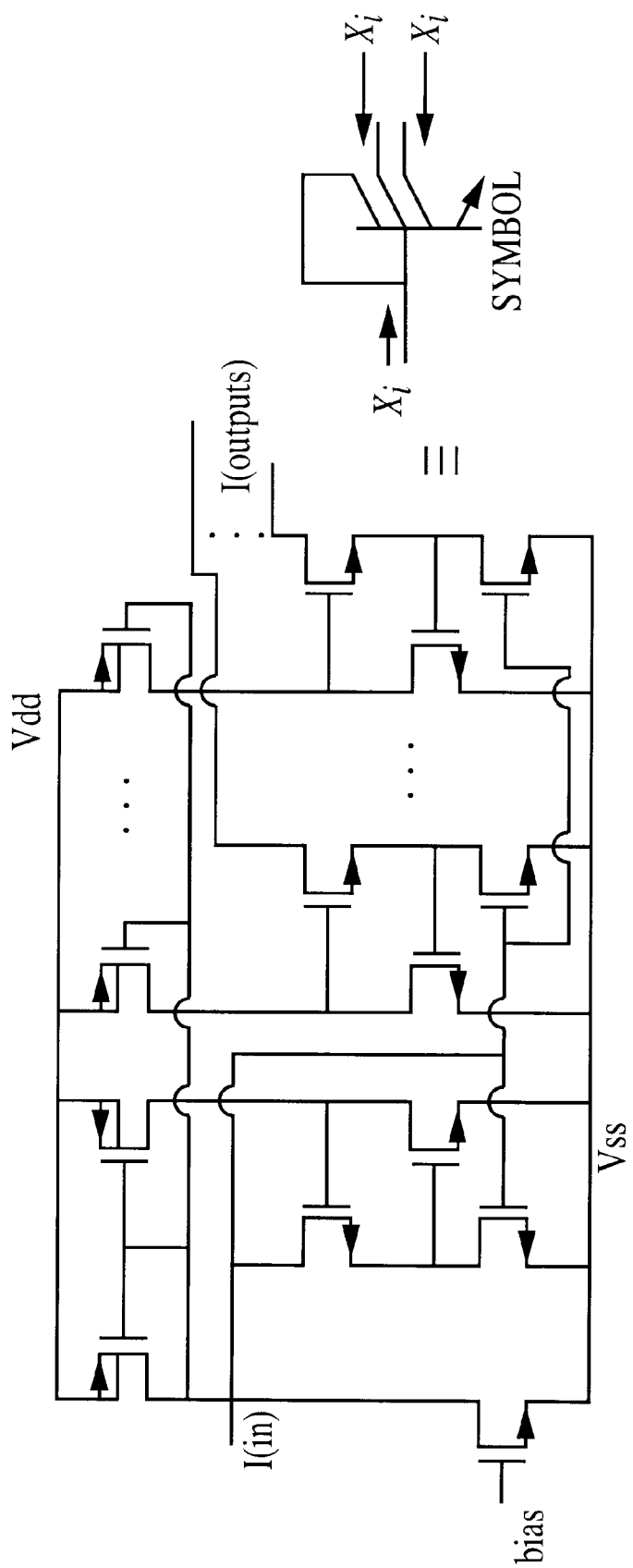
FIG. 4 is a diagram showing the circuit diagram for a current mirror and its symbol with single input and multiple outputs.
Figure 5:
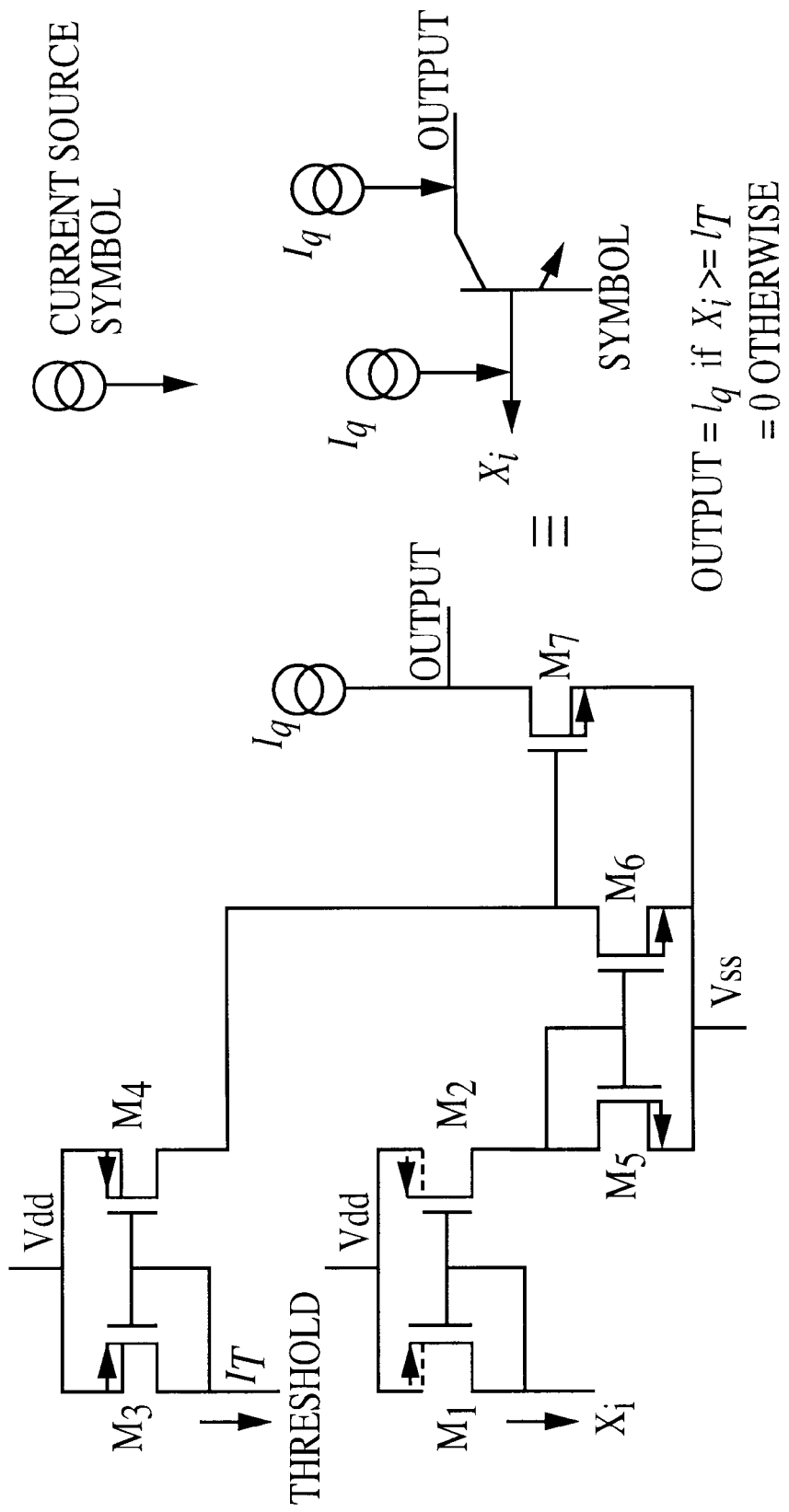
FIG. 5 is a diagram depicting a circuit for a threshold circuit and its symbol.

A current mirror is a circuit that sinks a maximum amount, $x_i$ of current through each of its outputs when an input of $x_i$ is applied. A preferred current mirror circuit used for the simulations is presented in FIG. 4. The current mirror circuit given in FIG. 4 is the same as the one given in Soma et al (3). However, in reference (3), a ground is connected where $V_{ss}$ is shown in FIG. 4. We used −1 V for $V_{ss}$. When $V_{ss}$ is connected to the ground, the output of the current mirror does not go to 0 μA and results in an actual output of 1.5 μA for the state "0" instead of 0 μA. This offset increased whenever the outputs of several current mirrors were added using a mod-p adder, resulting in wrong states. The operation of the current mirror is straightforward, and a detailed explanation can be found in (3, 16).

Threshold Circuit

A threshold circuit is basically used to determine whether an input current $x_i$ is greater than a threshold $I_T$. The output of a threshold circuit is equal to $I_q$ if input $x_i$ is greater than or equal to $I_T$, else the output is zero. The actual implementation of a preferred threshold circuit and the symbol used for it in schematic diagrams of mod-p adder, multiplier, etc., are presented in FIG. 5. The operation of the threshold circuit is as follows: transistors $M_1$ and $M_2$, form a current mirror; similarly, transistors $M_3$ and $M_4$; and $M_5$ and $M_6$ form current mirrors. When the input current $X_i$ is applied to the threshold circuit, due to current mirror action, $M_2$ supplies $x_i$ of current and the same $x_i$ amount is sunk by the transistor $M_5$. Since $M_6$ is a current mirror of $M_5$ it can only sink $x_i$ amount of current. Clearly $M_4$ is supplying $I_T$ amount of current. Hence if $x_i<I_T$ then $M_6$ cannot sink all the current, as a result the gate capacitor of transistor $M_7$ gets charged making gate-source voltage $V_{gs}$ greater than its threshold voltage $V_T$. As a result $M_7$ conducts sinking all the current $I_q$ resulting in an output of zero current. If $x_i \geq I_T$ then $M_6$ sinks all the current supplied by $M_4$ resulting in $V_{gs}<V_T$ at $M_7$ making it go into the cutoff region. Hence, $M_7$ does not sink any current supplied by $I_q$, and the output current is equal to $I_q$.

We will now present schematic diagrams for a mod-p adder, multiplier, and discretizer.

Mod-p Adder

Figure 6:
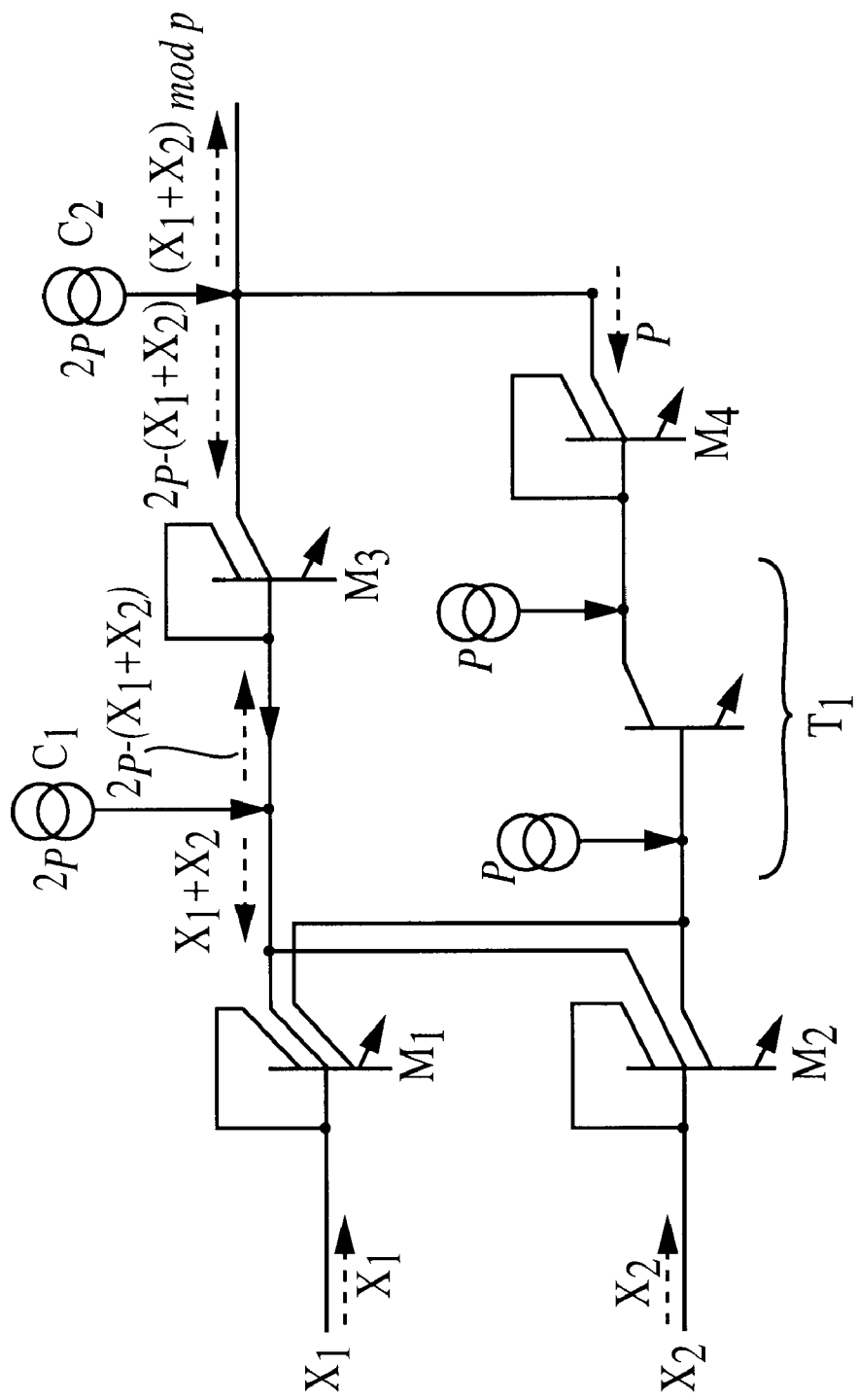
FIG. 6 is a diagram depicting a schematic diagram for a mod-p adder. The schematic is shown in terms of current mirrors and threshold circuits.

A schematic diagram for a preferred mod-p adder is shown in FIG. 6, and its operation is as follows. We assume that inputs $x_1$ and $x_2$, are discretized and $$x_1, x_2 \in \{0, 1, \ldots, p-1\}.$$

When $x_1+x_2$, is less than p, the output of threshold circuit $T_1$ is zero and hence no current is applied to the input of the current mirror M4 and, hence, it can not sink any current making the lower part of the schematic diagram consisting of $T_1$ and $M_4$ irrelevant. Since current mirrors $M_1$ and $M_2$ are drawing $x_1$ and $x_2$, amounts of current, respectively, from the current source $C_1$, the input current to M3 is $2p-(x_1+x_2,)$. Hence M3 sinks $2p-(x_1+x_2)$ from its output current source, leaving an output of $x_1+x_2$, which is less than p. When $x_1+x_2$, is greater or equal to p, the output of threshold circuit $T_1$ is p, which is applied to the current mirror $M_4$. $M_4$ in turn sinks p amount of current from the current source $C_2$—Since $x_1+x_2$, is greater than p, the current drawn by $M_3$ can be written as $p-(x_1+x_2 \bmod p)$. Hence the output is given by $2p-[p-(x_1+x_2 \bmod p)]=x_1+x_2 \bmod p$.

Figure 7:
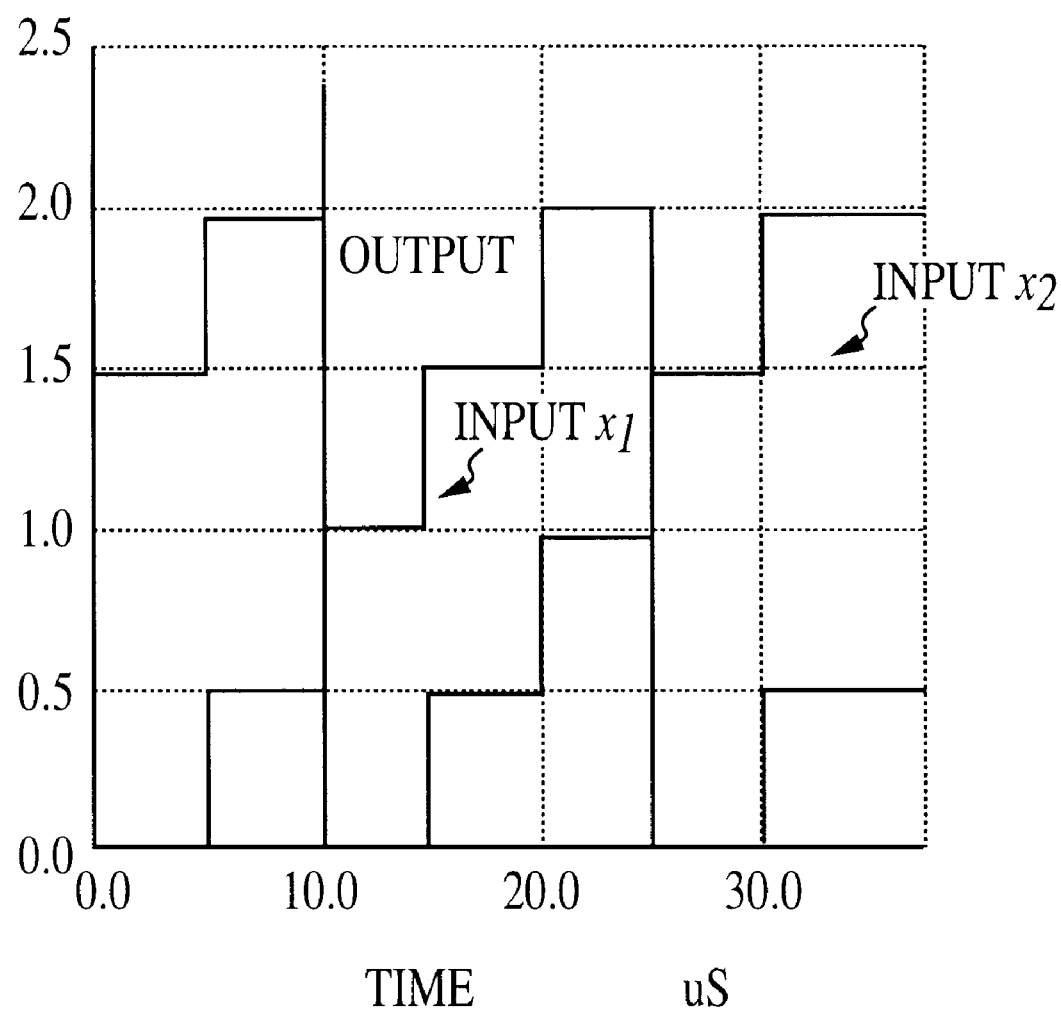
FIG. 7 is a diagram showing the simulation results of a mod-p adder for two specific inputs.

We have constructed a mod-p adder and simulated it using the analog circuit simulator software, SPICE, from University of California, Berkeley. The simulation results are shown in FIG. 7. The simulations are performed using a stair case current input (5 μA steps at intervals of 5 μs) for $x_1$ and 15 μA for $x_2$, and a 100 KΩ resistor connected at the output of the adder. For the purpose of simulations, we used p=5 and the step size for each state corresponds to 5 μA. Hence, the output of the mod-p adder can be either 0, 5, 10, 15, or 20 μA, corresponding to 0, 1, 2, 3, or 4 states, respectively. The voltage across the resistor is displayed in FIG. 7. We observe from the output that this operation is performed correctly. Design of mod-p adders when p Is a power of 2 can be similarly designed, and the details can be found in Hurst (7).

Mod-p Multiplier

Figure 8:
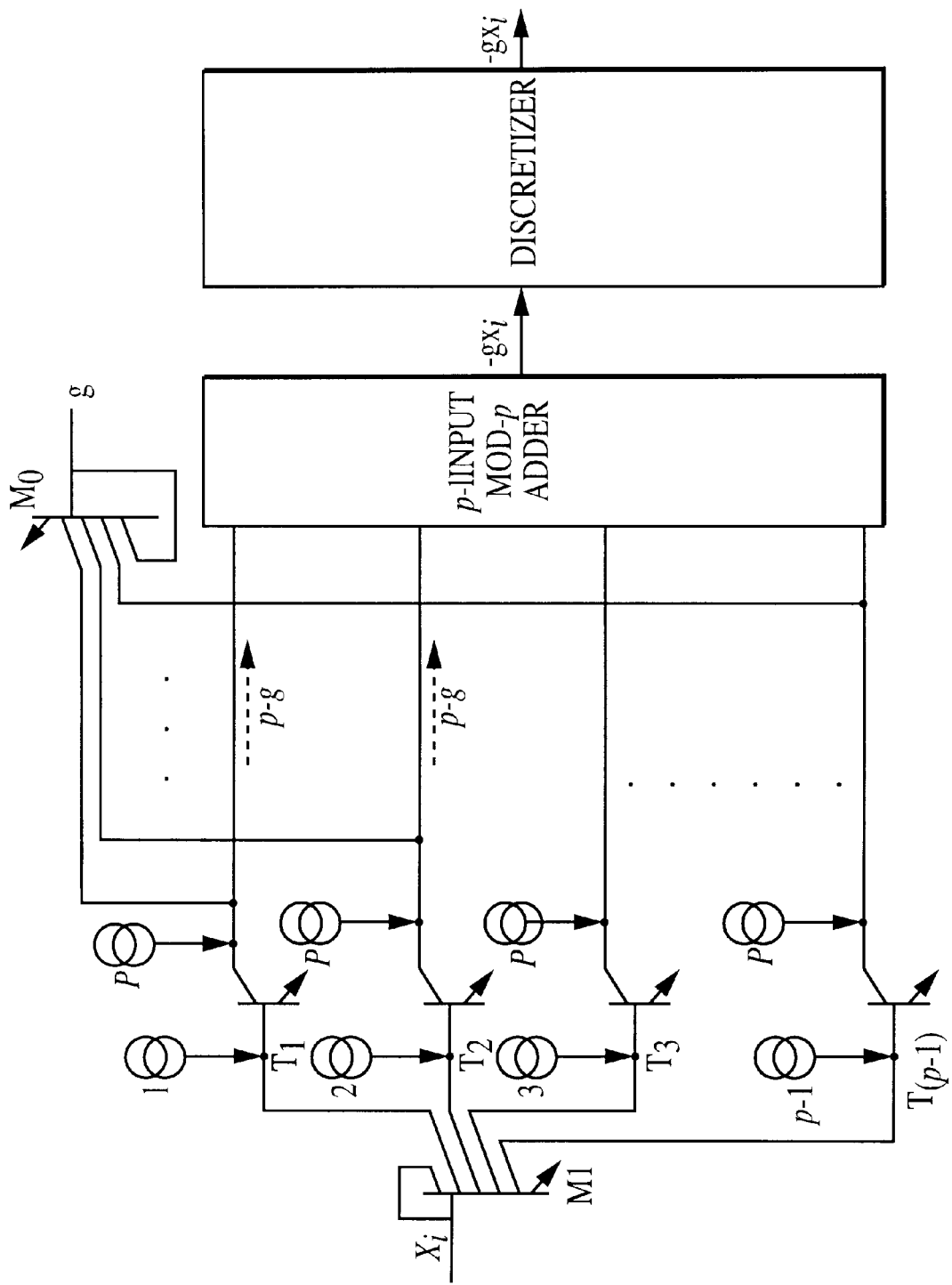
FIG. 8 is a diagram depicting a schematic diagram for a mod-p multiplier. The schematic is shown in terms of current mirrors, threshold circuits, multiple input mod-p adder and discretizer.

FIG. 8 presents a schematic diagram for a preferred mod-p multiplier. The operation of the multiplier is as follows: In FIG. 8, input 'g' to current mirror $M_0$ represents a fixed number with which we like to perform multiplication to compute $-g \cdot x_i \bmod p$, where $x_i$ is the multiplicand. Current mirror $M_0$ and the current sources $C_0$ to $C_{p-1}$ associated with its outputs form effective current sources of p−g current to the respective threshold circuits $T_1$ to $T_{P-1}$. Hence, depending on the value of $x_i$, the output of the threshold circuit $T_j$, $j \in \{0,1,\ldots,p-1\}$ can be either 0 or p−g and, therefore each input to the mod-p adder is either 0 or p−g. For example, if $x_i$,32 n, then the outputs of threshold circuits $T_1$ to $T_n$ will be p−g, since the threshold conditions for them are met, with the remaining outputs being zero. Hence $n(x_i)$ number of inputs to the adder are p−g (or −g mod p). Therefore, the output of the adder equals to $-g \cdot n \bmod p$ or $-g \cdot x_i \bmod p$.

When we implemented the mod-p multiplier circuit, simulation results showed an offset of 1 to 2 μA. This, as such, did not cause a problem in determining the state of the multiplier output; however, when this output was added with other outputs, the offset continued to increase. This continuous increase over a period of time resulted in wrong states.

We eliminated the problem by passing the adder output through a signal discretizing circuit (basically eliminating the offset). In digital systems, every time a signal passes through a gate it is reconditioned into either a "0" or a "1" as the case may be. In essence, the discretizer performs the same operation and reconditions the signals. Note that the multiple input mod-p adder shown in FIG. 8 is constructed similar to the circuit given in FIG. 6.

Figure 9:
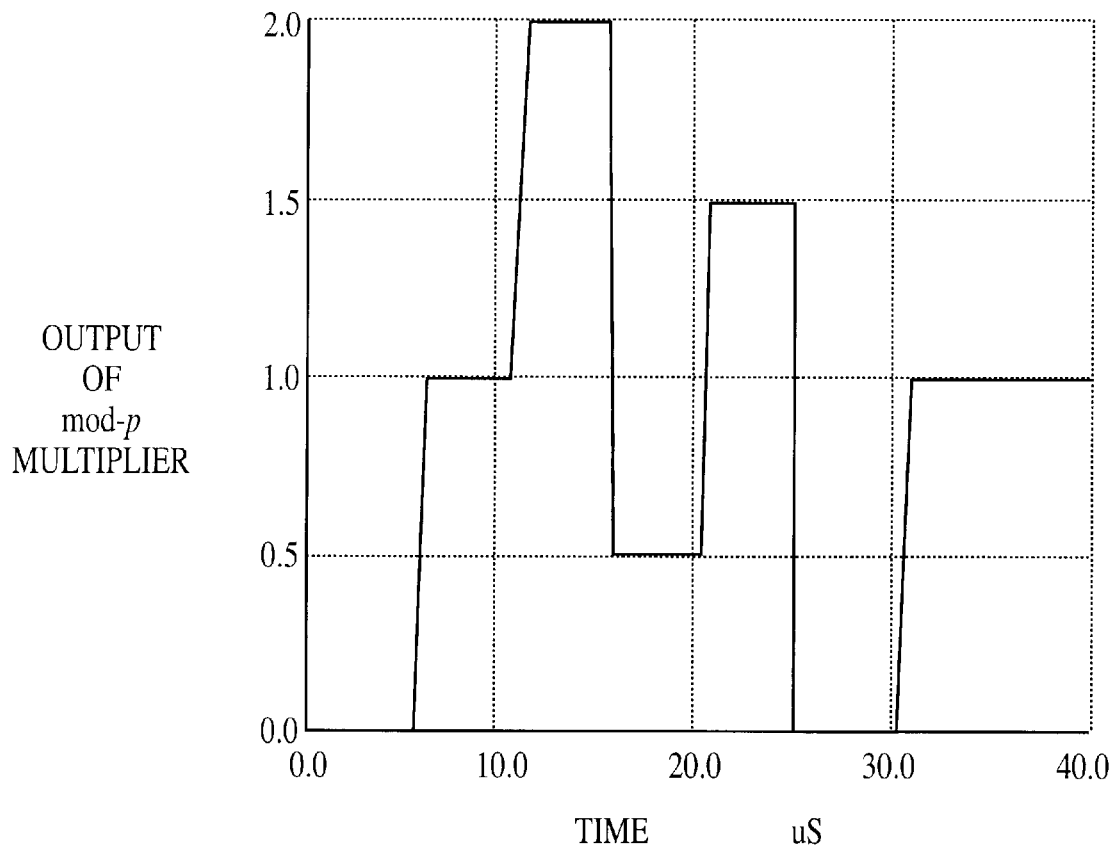
FIG. 9 is a diagram showing the simulation results of a mod-p multiplier for two specific inputs.

Simulation results for the multiplier designed are shown in FIG. 9 for the case where $x_i$ is a stair case current input (5 $\mu$A steps at intervals of 5 $\mu$s) and a steady 15 $\mu$A for g (same inputs used for mod-p adder simulations; refer to FIG. 7.) Just as in the case of mod-p adder simulations, a resistor is connected at the output of the discretizer. So actual current output of the discretizer is the voltage indicated in FIG. 9 divided by 100 K$\Omega$. From FIG. 9, it is clear that the multiplier operations are correct and satisfactory.

We find the design of threshold circuits to be crucial for correct operation of multiplier or adder. If the design is not correct, one may find a delay in change from one state to another. It also can contribute to the offset in states; that is, instead of an output of 10 $\mu$A for state "2" we may actually get 9 $\mu$A, etc.

Discretizer

Figure 10:
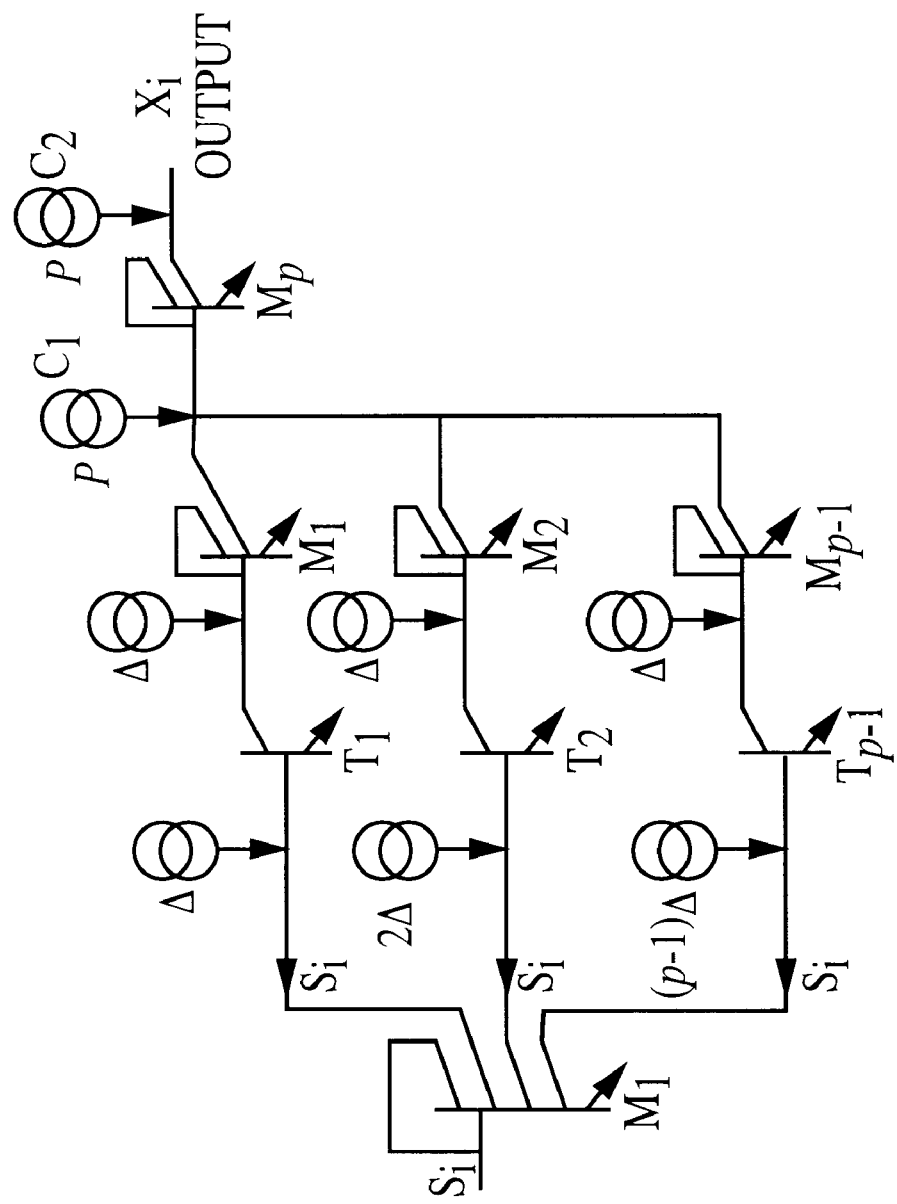
FIG. 10 is a diagram depicting a schematic diagram for a signal discretizer. The schematic is shown in terms of current mirrors and threshold circuits.
Figure 11:
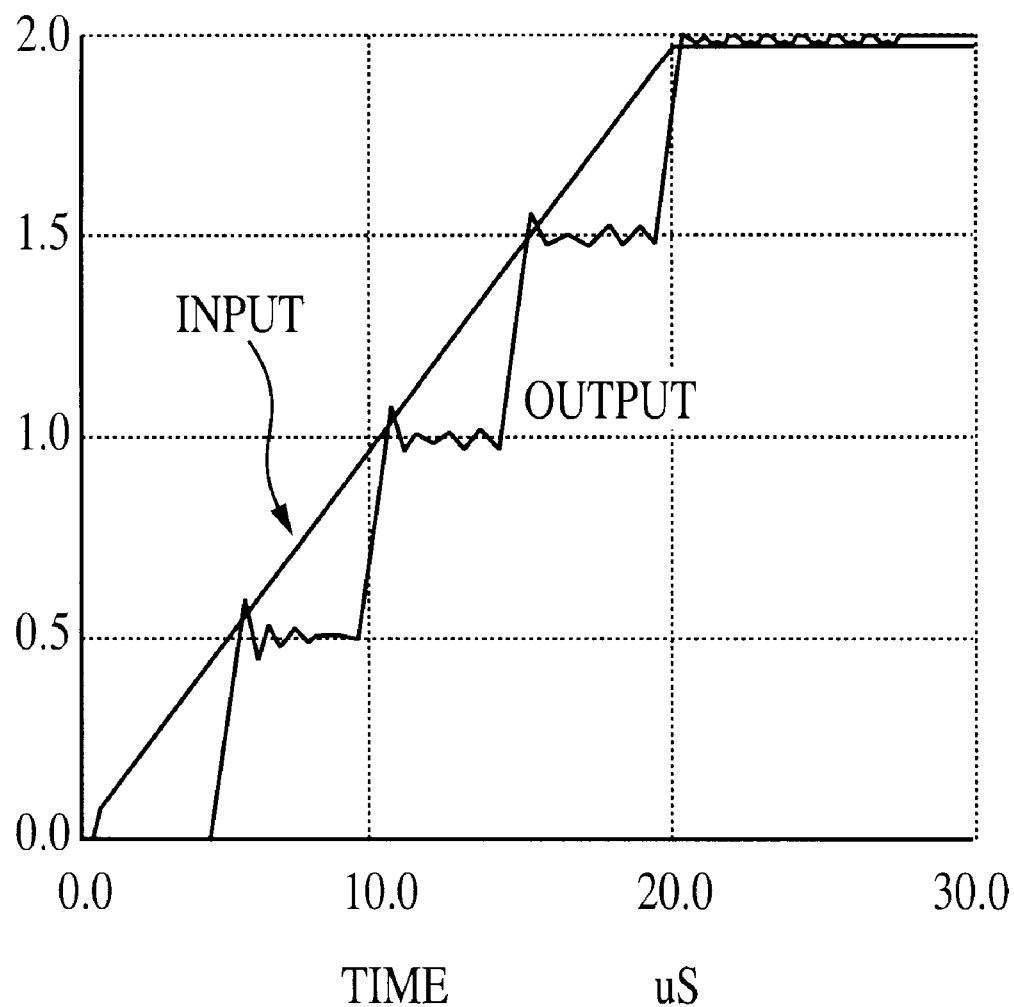
FIG. 11 is a diagram showing the simulation results of a signal discretizer for a specific input.

The schematic diagram for a discretizer circuit is shown in FIG. 10. Current $\Delta$ in FIG. 10 represents the step size, which is determined based on the maximum deviation allowed in a current for a fault-free circuit at any test node due to allowable tolerances in discrete components in an analog circuit. Determination of $\Delta$ is discussed later. When a signal $s_i$ is applied to the current mirror $M_0$, each one of its outputs sinks a maximum of $s_i$ amount of current from its respective current sources. If $s_i=\Delta$, then the output of the threshold circuit $T_1$ is $\Delta$, which is applied to the current mirror $M_1$. Hence the output of $M_1$ sinks $\Delta$ amount of current from the current source $C_1$, while the rest of the current mirrors $M_1$ to $M_{p-1}$ do not sink any current. Hence the input to the current mirror $M_p$ is p–$\Delta$, which in turn sinks the same amount from the current source $C_2$, leaving an output current of $\Delta$. Similarly, if $s_i=2\Delta$, then current mirrors $M_1$ and $M_2$ each sink $\Delta$ amount from $C_1$, leaving an input of p–2$\Delta$ to $M_p$ and hence the output of the discretizer is 2$\Delta$. Therefore, the output increases in steps of $\Delta$. The operation is similar for other values of $s_i$. FIG. 11 gives the simulation results when a ramp input of 1 $\mu$A to 20 $\mu$A is applied as $s_i$ for a step size $\Delta$=5 $\mu$A.

Sample and Hold Circuit

There have been several circuits proposed for sample and hold circuits in the literature (3, 8, 9). Daubert et al., (10) have proposed current copier cells, and Wei and Krishnan (8) have used it for a current-based, built-in self-test (BIST). Current copiers use a capacitor to store information, which would require a large silicon area (9). Soma et al., (3, 9) showed that the current mirrors designed using super transistors (regulated cascode circuit) are desirable. They designed master-slave analog sample and hold circuits using these current mirrors, which are then used for storing and shifting data similar to scan cell circuits in digital systems.

The general principles of analog scan cells are described here. The basic structure of a preferred current based analog scan cell is shown in FIG. 12.

Figure 13:
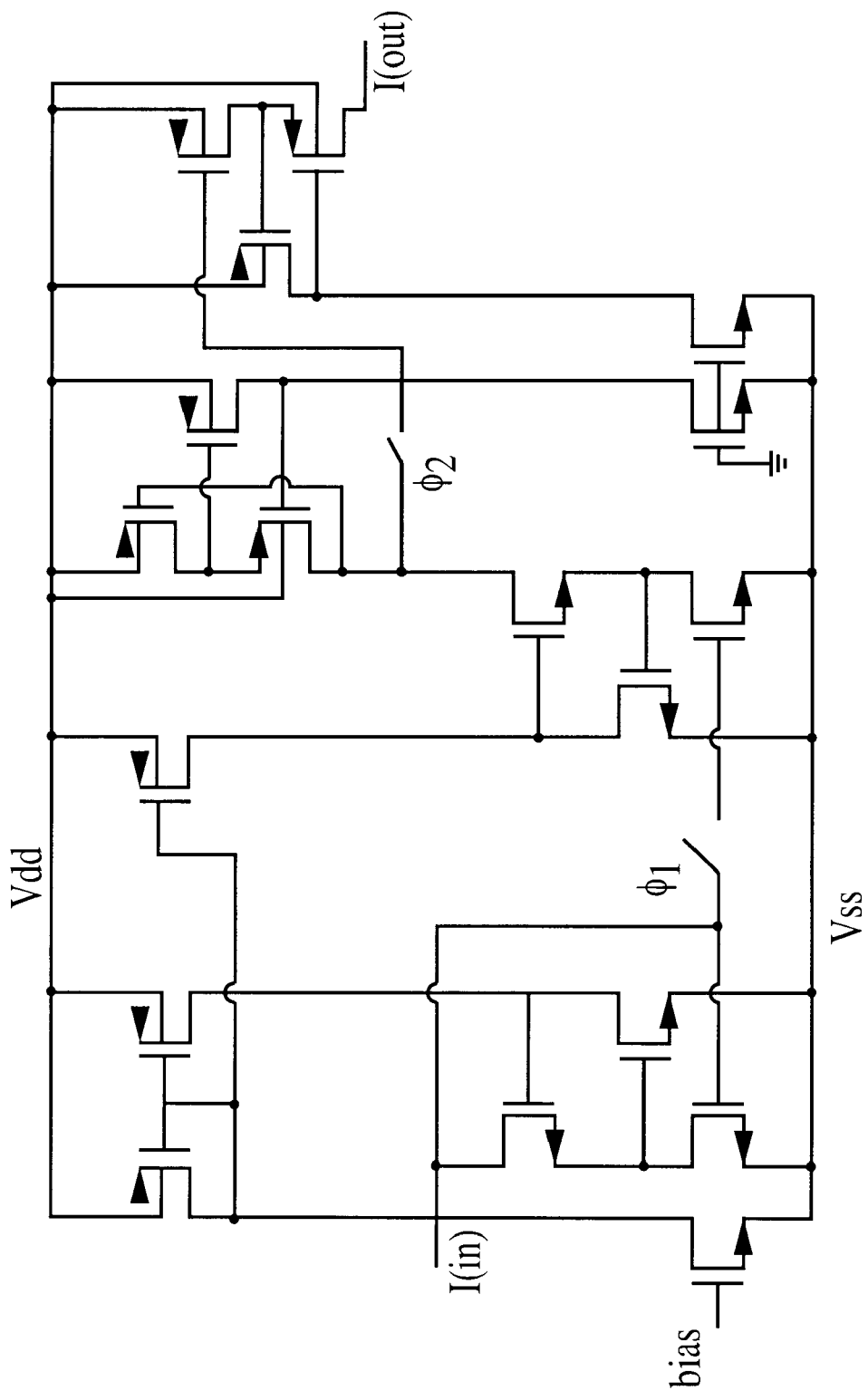
FIG. 13 is a diagram depicting a sample and hold circuit (scan cell).

The output of a test point is sampled by closing switch $S_0$. Note that the voltage-to-current converter (V-I converter) is needed only if voltage is being sampled. The sampled data is stored in the master current mirror. By closing switch $S_2$, the data is transferred from the master to slave current mirror. Closing switch $S_1$ will transfer data from a slave current mirror to the next master current mirror performing the shift operation. In order to perform shift operations in this manner, two clocks are needed, namely, $\phi_1$ and $\phi_2$. Switches $S_0$ and $S_1$ are operated by clock $\phi_1$ that is, they close when $\phi_1$ is high. Closing of the switches $S_0$ and $S_1$ allows the mod-p sum of sampled node data and the data from the adjacent cell to be stored in the master current mirror. Switch $S_2$ is operated by clock $\phi_2$ which allows the shifting of data from master current mirror to slave current mirror. Several circuits are proposed in the literature (3, 9). The designer can use a circuit that is appropriate to the particular application. A preferred sample and hold circuit for this invention is shown in FIG. 13

Figure 14:
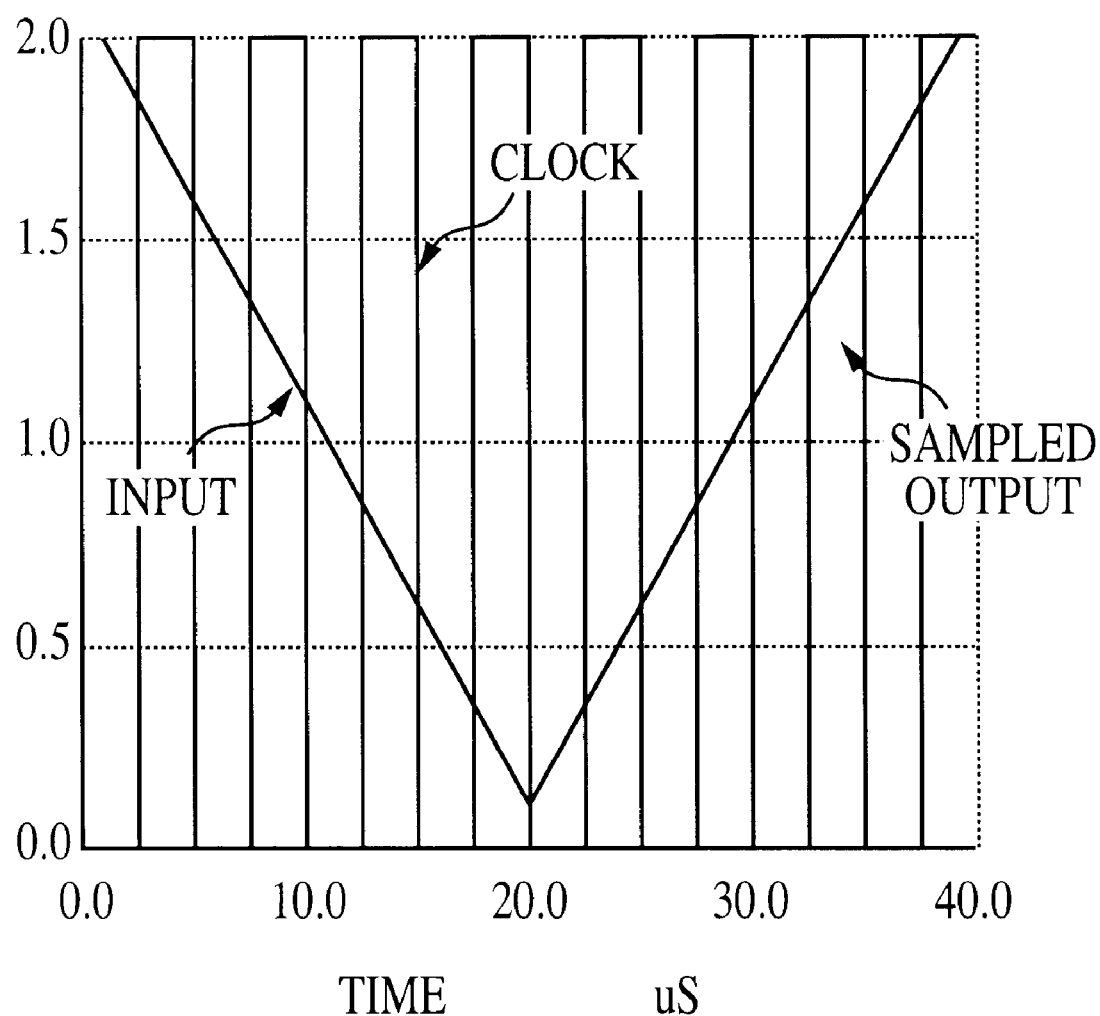
FIG. 14 is a diagram showing the simulation results of a sample and hold circuit for a specific input.

For simulation purposes, we used a clock with a 2.5 $\mu$s pulse width and a 5 $\mu$s period for $\phi_1$ and its complement for $\phi_2$. For input current, we used a linear waveform that spans from 20 to 1 $\mu$A and then back to 20 $\mu$A. The simulation results are presented in FIG. 14. From the simulations, we find a difference of 0.1 $\mu$A between the actual output and the input. This difference did not cause any problems in the simulations of the signature generation.

So far we have provided designs for all components needed to build a signature generator. Next we discuss the design considerations for implementing a signature analyzer. Note that we make the distinction between signature generator and signature analyzer. The former consists of a circuit that performs division of two polynomials while the latter is comprised of a complete built-in test mechanism including a signature generator for analog or mixed signal systems.

Design Considerations for Signature Analyzer

We assume that a CUT can be operated in two modes, (a) normal mode and (b) test mode. In test mode, a steady analog input (for example, a sine wave) of predetermined amplitude is applied to the CUT. Proper selection of frequency and amplitude for the input is shown to be very important (12). Several test points/nodes in a CUT are selected for monitoring due to their importance in diagnosing the CUT (11). These test points are determined by the fault models and fault dictionaries (12) used and by computing sensitivity analysis at these nodes. Whenever a voltage is sampled, it is automatically converted into current using a voltage-to-current converter, since the signature analyzer is based on current-mode operation. We assume that the voltage-to-current converter characteristics are linear, which in turn allows us to work with either current or voltage interchangeably. In order to design a signature analyzer, we need to determine a suitable value for p, and the number of states in a signature generator (that is the degree of the dividing polynomial g(x)). We determine the radix p based on the maximum deviation allowed in the current at any test point. The number of stages in a signature generator is selected depending on the minimum probability of aliasing (probability of declaring a faulty circuit as fault free) required once p is chosen.

Determination of Radix p

In order to compute the maximum deviation in current at any test point, we perform SPICE simulations of the circuit to determine the maximum and minimum current at each test point with respect to the allowed tolerances in discrete components (namely, resistors, capacitors, and inductors) and the parameter variations in active components such as transistors, using Monte Carlo simulations. Let the maximum deviation in current at any test point is given by $\delta$ and the maximum output current at any test point be $I_M$. Then the radix p is computed as $$p = \frac{I_M + 1}{2\delta}$$

The step size is set at $\Delta=2\delta$. The circuit that discretizes the input signal is given in FIG. 10.

Level Shifter Circuit

Figure 15:
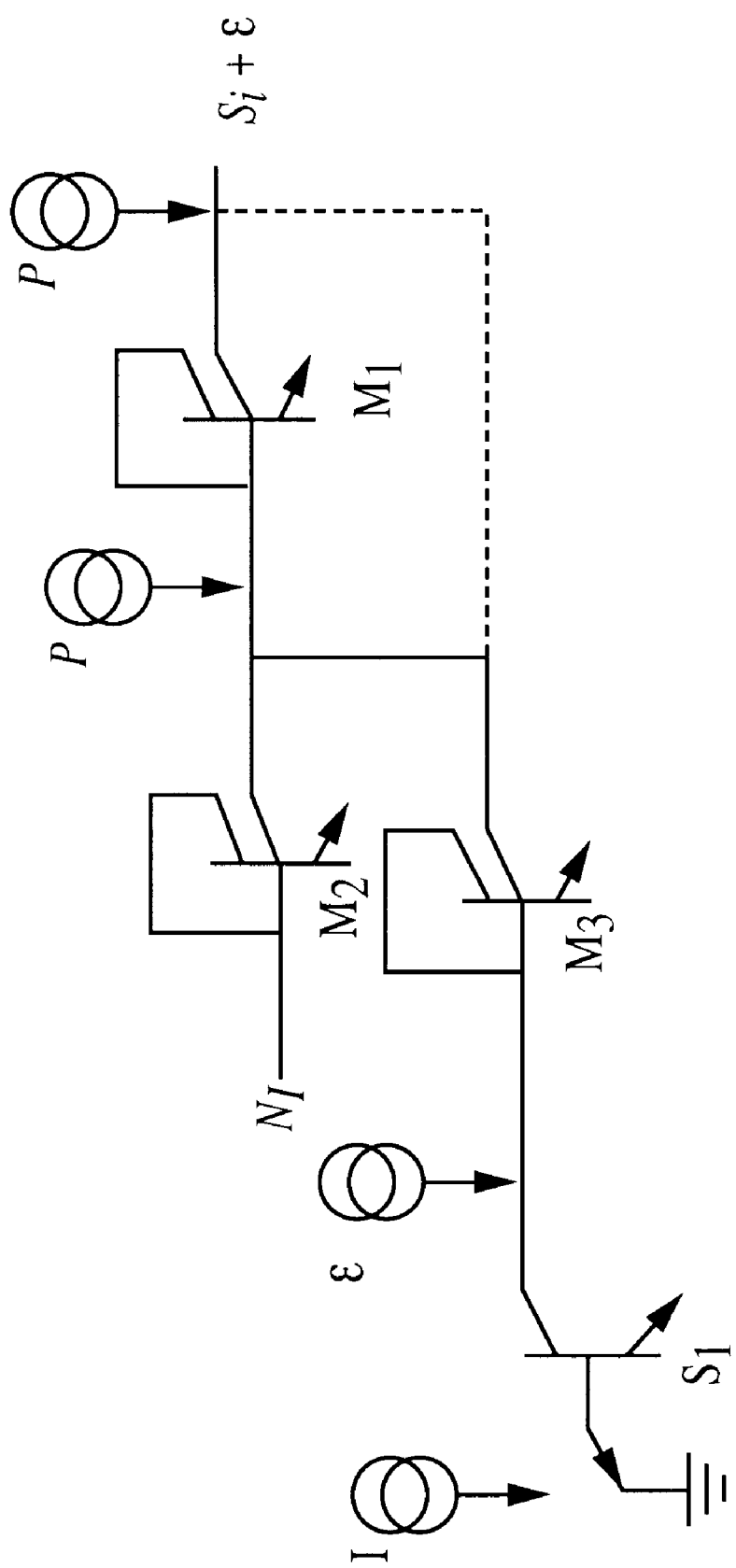
FIG. 15 is a diagram depicting a schematic for a level shifter circuit. The schematic is shown in terms of current mirrors and threshold circuits.

Unlike in digital circuits, analog signals have no definite states. An analog signal sampled at a test point may lie close to the border of two states upon discretization and hence it may change from one state to another due to allowable deviation in current at that node. This would result in wrong signature. For example, let p=5 and each discrete step correspond to 5 $\mu$A. Let the average signal level of a test point be $S_i=11$ $\mu$A and the allowable deviation at that node be $\pm 2$ $\mu$A. Hence the signal $s_i$ can swing from 9 to 13 $\mu$A. As a result, the discretized signal $x_i$ ($x_i$ is the discretized state of $s_i$) can change from state 1 to state 2. Since we can only use one discrete state for $x_i$, we make the decision that $x_i$ should be 2, as long as it is within the allowable tolerance. This can be achieved by shifting the signal value $s_i$ by $\epsilon$ which would put the $s_i+\epsilon$ the middle of the discrete step size. FIG. 15 gives one possible configuration for a level shifter circuit which would add $\epsilon$ to the input signal $s_i$. The operation of the level shifter circuit shown in FIG. 15 is straightforward.

Figure 16:
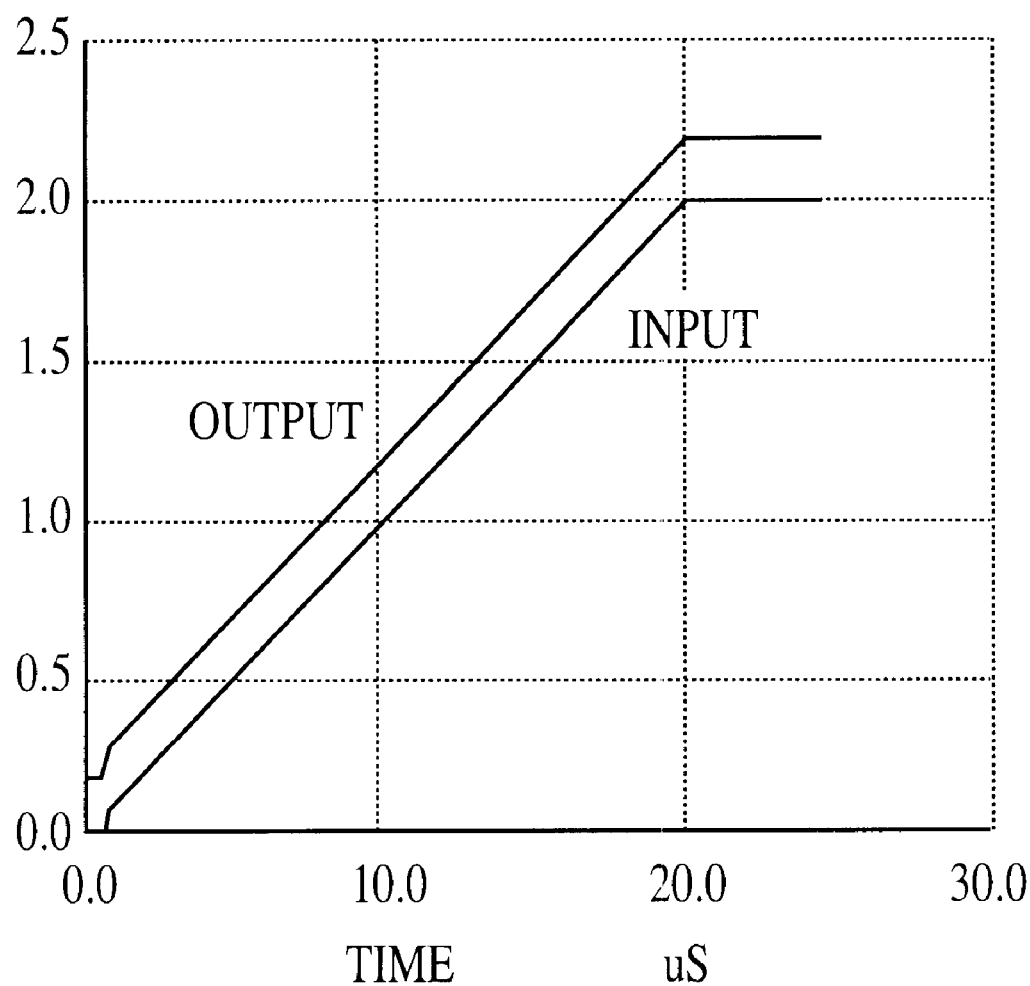
FIG. 16 is a diagram showing the simulation results of a level shifter circuit for a specific input.

We note that not all inputs require level shifters. Even though the level shifter circuit shown in FIG. 15 is used for shifting input signal by $+\epsilon$, it can be readily adopted to shift by $-\epsilon$ by connecting the output of $M_3$ to the output of $M_1$, as indicated by a dotted line. FIG. 16 show simulation results of a level shifter for a ramp input of 1 to 20 $\mu$A and $\epsilon=2$ $\mu$A.

Probability of Aliasing

Probability of aliasing $P_a$ is defined as the probability of wrongly identifying a faulty CUT as fault free. Clearly, one would like to have the probability of aliasing as low as possible. In the case of digital systems using an m bit signature generator, the probability of aliasing is shown to be $2^{-m}$. It is shown (13) that the probability of aliasing. $p \geq 2$ as $$P_a = p^{-m}$$

Signature Analyzer Implementation

In order to implement the signature analyzer, the data from test points are sampled and converted into current if necessary. The data is then stored in storage elements and shifted using clocks $\phi_1$, and $\phi_2$, as discussed earlier. FIGS. 1 and 2 show two possible implementations for the signature analyzer corresponding to two possible configurations for the signature generator, (a) linear feedback shift register (LFSR) configuration and (b) multiple input shift register (MISR) configuration. FIG. 1 gives the LFSR configuration for a divisor polynomial g(x), a primitive polynomial, which is given by $$g(x)=x^5+4x+3$$

Figure 17:
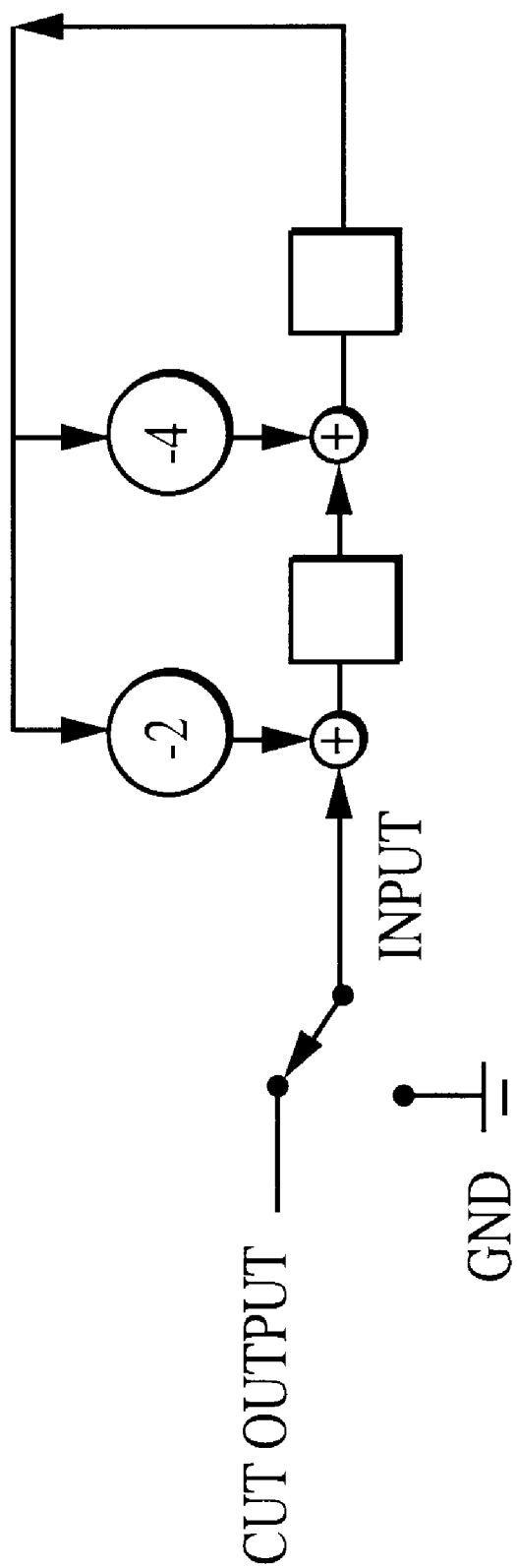
FIG. 17 is a diagram depicting the LFSR configuration for signature analyzer simulations.

For the mod-p adder, mod-p multiplier and storage elements in FIG. 17, the circuits in FIGS. 6, 8, and 13 are used. The operation of the whole system is as follows. One of the test analog inputs is applied to the CUT and the outputs of the test points are shifted and stored by applying clocks $\phi_1$ and $\phi_2$ to the storage elements, as explained earlier. Once all the outputs are shifted into the signature generator, the next test signal is applied to the CUT. and the process of shifting the outputs is repeated until all the analog signals are applied to the CUT. After applying all the analog test signals and shifting what is left in the signature generator is the signature. For simulation purposes, we used an LFSR with g(x) which is a primitive polynomial and is given by $$g(x)=x^2+4x+2$$

Figure 18:
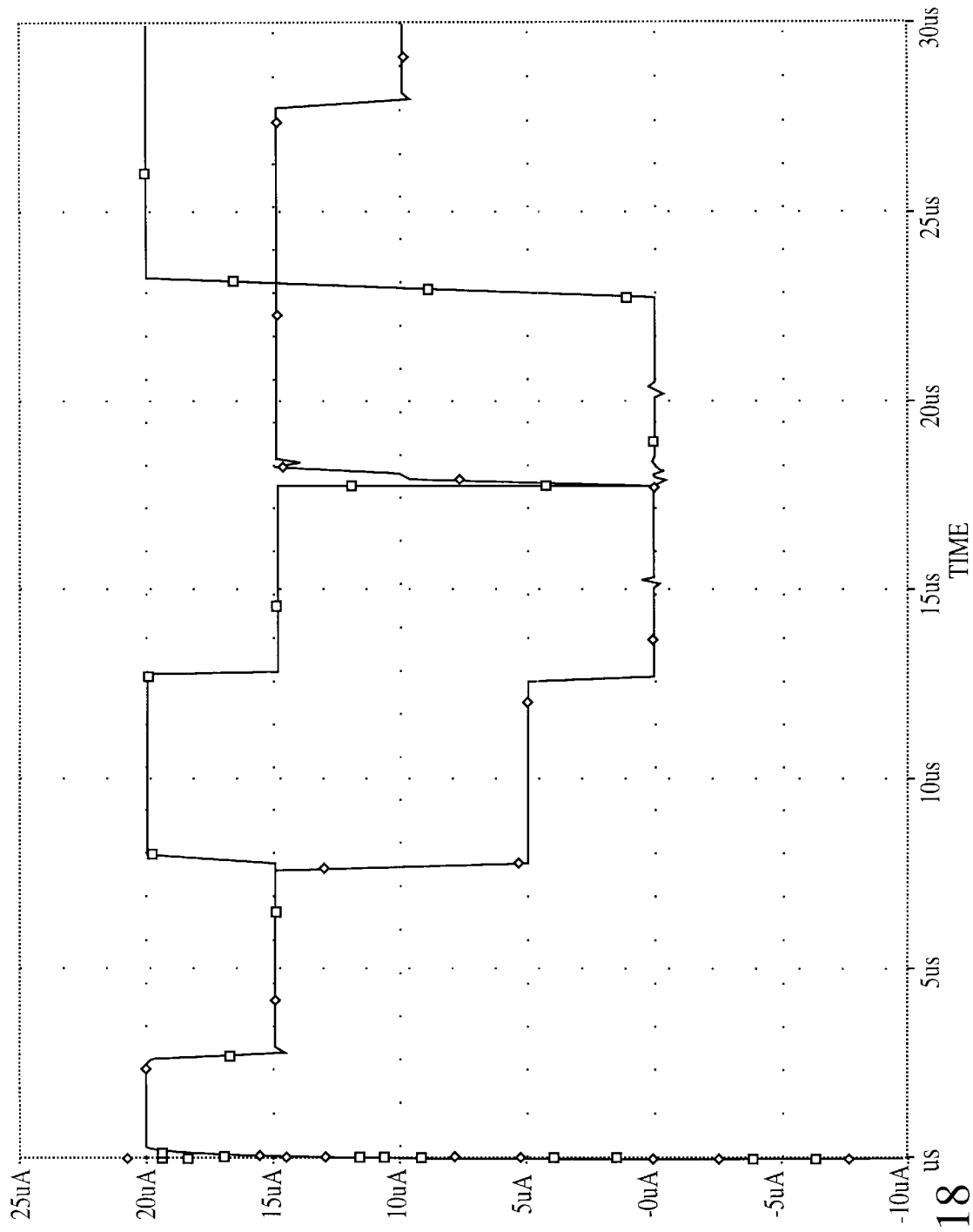
FIG. 18 is a diagram showing the simulation results of the LFSR configuration given in FIG. 17.

The simulations are carried out for an input of (1,0, ... ,0). FIG. 18 shows the output of the LFSR simulation results. Table 1 gives the expected outputs of the LFSR. From FIG. 18 and Table 1 we see that the LFSR has worked as expected with an initial state (3,3) for the LFSR.

We note that the value of p, the degree of the divisor polynomial is selected arbitrarily for this example to keep the circuit simple. In practice the number of test points could be large and the degree of the divisor polynomial may be greater than 10. The primitive polynomials can be found in various text books (6, 14).

One of the problems for LFSRs is to make sure that the LFSR always starts in a known state before applying input to it. Unlike flip-flops, sample and hold circuits are difficult to reset. In order to make sure the LFSR always starts in a known state, one can connect a double pole single throw switch at its input as shown in FIG. 17. For initializing the LFSR the switch is connected to the ground, and several clocks are applied till the state of the LFSR is (000 ... 0), and the switch is thrown to the CUT output port.

In order to ensure proper operation of the LFSR, we connected the discretizer at the output of each sample and hold circuit in FIG. 17.

Having thus shown and described what is at present considered to be preferred embodiments of the present invention, it should be noted that the same have been made by way of illustration and not limitation. Accordingly, all modifications, alterations and changes coming within the spirit and scope of the present invention are herein meant to be included.

REFERENCES (1) Williams T. W., and Eichelberger E. B., "A logic design structure for testability," Proc. *IEEE 14th Design Automation Conf.*, pp. 463–468 (DATE?).
(2) Design of Testable Logic Circuits by R. G. Bennetts, Chapter 3. Addison-Wesley Publishers Limited, 1984.
(3) Mani Soma, T. M. Bocek, Tuyen D. Vu, and J. D. Moffatt, "Experimental results for current based analog SCAN," *Proc. of ITC*, 1997, pp. 108–111.
(4) T. Damarla and F. Hossain, "Spectral Techniques for Multiple Valued Logic Circuits," IEEE Proc. of the Intl. Symposium on Multiple Valued Logic, held at Victoria, Canada on May 26–29, 1991.
(5) Built-in Test for VLSI, Pseudorandom Techniques, by P. H. Bardell, William H. McAnney and J. Savir by John Wiley and Sons, New York, 1987.
(6) Error Correcting Codes by W. W. Peterson and E. J. Weldon, Jr., The MIT Press, Cambridge, Mass., 1984.
(7) S. L. Hurst, "Multiple-Valued Logic—Its Status and Its Future," *IEEE Trans. on Computers*, Vol. C-33, No. 12, 1984, pp. II60–1179.
(8) Chin-Long Wey and S. Krishnan, "Built-In Self Test (BIST) Structures for Analog Circuit Fault Diagnosis with Current Test Data," *IEEE Trans. on Instrumentation and Measurement*, Vol. 41, No. 4, August 1992, pp. 535–539,
(9) Mani Soma, "Structure and Concepts for Current-Based Analog Scan," Proc. of 1995 Custom Integrated Circuits Conference, Santa Clara, Calif., pp. 517–520.
(10) S. J. Daubert, D. Vallancourt, and Y. P. Tsivids, "Current copier cells," *Electronics Letters*, Vol. 24, December 1988, pp. 1560–1562.

(11) D. L. Rhodes, G. Tempel and M. Cummings, "Application of Fault Modeling to Continuous Built-In Test (c-BIT) for Microwave and MMIC Circuits." *Intl. Jour. of Microwave and Millimeterwave CAD.*

(12) N. Naui, A. Chattejee, and J. A. Abraham, "DRAFTS: Discretized Analog Circuit Fault Simulator," *Proc. of IEEE Design Automation Conference,* 1993, pp. 509–514.

(13) J. E. Smith, "Measures of the Effectiveness of Fault Signature Analysis." *IEEE Transactions on Computers,* Vol. C-29, No. 6, June, 1980, pp. 510–514.

(14) Introduction to finite fields and their applications by R. Lidl and H. Niederreiter, published by Cambridge University Press, Cambridge, 1988.

(15) C. Toumazou, F. J. Lidgey and D. G. Haigh, "Analog IC Design: the current-mode approach," published by Peter Peregrinus Ltd., London, UK.

(16) E. Sackinger, and W. Guggenbuhl, "A high-swing, high-impedance MOS cascode circuit," *IEEE Journal of Solid State Circuits,* Vol. 25, No. 1, February 1990, pp. 289–298.

(17) T. Raju Damarla and P. Nagvajara, "Signature Analysis for Analog Circuits" , in *Proc. of Intl. Mixed-Signal Testing Workshop,* The Hague, The Netherlands, 1998, pp. 107–112.

I claim:

1. A circuit for testing analog and mixed signal integrated circuits under test, comprising:

means for supplying an analog test signal to the analog or mixed signal circuit under test;

means for discretizing a plurality of test signal values from nodes of the circuit test into p discrete levels;

an array of storage elements for storing the discretized test signal values; and a radix p signature generator for comparing the stored test signal values to reference signals to determine whether the circuit under test is fault free.

2. The circuit for testing analog and mixed signal integrated circuits under test of claim 1 including voltage to current converter means interconnected between the circuit under test and said means for discretizing.

3. The circuit for testing analog and mixed signal integrated circuits under test of claim 2 including level shifter circuit means interconnected between said voltage to current converter means and said means for descretizing.

4. A method of monitoring an analog or mixed signal circuit under test comprising:

constructing an input polynomial using monitored data from test points of the circuit under test;

dividing the input polynomial by a primitive polynomial to determine coefficients of a remainder to obtain a signature; and comparing the signature to a reference signature to determine whether the circuit under test is fault free.

5. A method of testing an analog and mixed signal curcuit under test, comprising:

supplying a plurality of analog test signals to the circuit under test;

sampling outputs from test nodes of the circuit under test in response to the analog test signals;

discretizing the outputs to obtain outputs having p discrete levels;

dividing the discretized outputs by a predetermined polynomial in a radix p signature generator to obtain a signature; and comparing the signature with a reference signature to determine if the circuit under test is fault free.

6. The method of claim 5 wherein said outputs from test nodes and said outputs having p discrete levels represent currents.

7. An apparatus for diagnosing faults in an analog circuit under test, comprising:

a radix p discretizer connectable to preselected locations in the analog circuit for receiving analog signals from test nodes of the circuit under test and generating resultant test signatures for the circuit under test;

a radix p signature generator connectable to the discretizer;

means for storing predetermined correct signatures associated with selected locations in the circuit under test; and means for electronically comparing the test signatures with the predetermined correct signatures in a predetermined manner.

8. An apparatus in accordance with claim 7 wherein the signature generator comprises a linear feedback shift register.

9. An apparatus in accordance with claim 7 wherein the signature generator comprises a multiple input shift register.

10. An apparatus according to claim 9 wherein the signature generator comprises at least one mod-p adder.

11. An apparatus according to claim 10 wherein the signature generator comprises at least one multiplier.

12. The apparatus according to claim 11 further comprising a level shifter circuit.

13. An apparatus according to claim 7 wherein the signature generator comprises at least one mod-p adder.

14. An apparatus according to claim 13 wherein the signature generator comprises at least one multiplier.

15. The apparatus according to claim 7 further comprising a level shifter circuit.

16. A method for testing analog and mixed signal circuits, comprising:

(a) supplying a plurality of analog test inputs to a circuit under test;

(b) sampling a set of analog outputs $\{x_1, x_2, \ldots, x_k\}$ from nodes of the circuit under test in response to the analog test inputs;

(c) discretizing the set of outputs $\{x_1, x_2, \ldots, x_k\}$ into p discrete levels;

(d) loading the discretized test signal values into a radix p signature generator; and (e) comparing the discretized test signal values to reference signal values to determine whether the circuit under test is fault free.

\* \* \* \* \*